United States Patent

Inaba

[11] Patent Number: 5,857,257
[45] Date of Patent: Jan. 12, 1999

[54] METHOD OF MANUFACTURING MAGNETIC HEAD SUSPENSION HAVING CIRCUIT WIRING PATTERN

[75] Inventor: Masaichi Inaba, Ushiku, Japan

[73] Assignee: Nippon Mektron, Ltd., Tokyo-to, Japan

[21] Appl. No.: 858,461

[22] Filed: May 19, 1997

[30] Foreign Application Priority Data

Sep. 27, 1996 [JP] Japan ................................. 8-257006

[51] Int. Cl.⁶ ....................................................... G11B 5/42
[52] U.S. Cl. ........................... 29/603.04; 216/52; 216/94; 360/103; 360/104
[58] Field of Search ............................ 29/603.04, 603.05, 29/603.06, 603.01; 360/103, 104; 216/75, 94, 100, 52

[56] References Cited

U.S. PATENT DOCUMENTS

| | | |
|---|---|---|
| 3,508,815 | 4/1970 | Johnson . |
| 4,208,257 | 6/1980 | Hom-ma et al. . |
| 4,432,027 | 2/1984 | Higuchi . |
| 4,645,280 | 2/1987 | Gordon et al. . |
| 4,823,217 | 4/1989 | Kato et al. . |
| 5,121,273 | 6/1992 | Slezak . |
| 5,185,683 | 2/1993 | Oberg et al. . |
| 5,339,217 | 8/1994 | Cohen et al. . |
| 5,454,158 | 10/1995 | Fontana, Jr. et al. . |
| 5,528,819 | 6/1996 | McKay et al. . |
| 5,535,074 | 7/1996 | Leung . |
| 5,536,584 | 7/1996 | Sotokawa et al. . |
| 5,597,496 | 1/1997 | Masaichi et al. . |

FOREIGN PATENT DOCUMENTS

| | | |
|---|---|---|
| 53-74414 | 7/1978 | Japan . |
| 63-11317 | 5/1988 | Japan . |
| 258547 | 11/1993 | Japan . |

*Primary Examiner*—Carl E. Hall
*Attorney, Agent, or Firm*—Foley & Lardner

[57] ABSTRACT

A method of manufacturing a magnetic head suspension having a circuit wiring pattern member such that a circuit wiring pattern is formed integral with a suspension via a flexible insulating base member, comprising the steps of: preparing a laminated plate composed of a flexible insulating base member (2), a conductive layer (6 or 3) formed on one surface thereof, and an elastic metal layer (5 or 1) formed on the other surface thereof; forming a desired circuit wiring pattern (3) in the conductive layer (6) of the laminated plate and an elastic suspension (1) in the elastic metal layer (5) thereof simultaneously, in accordance with photo-fabrication method including both-side simultaneous exposure method; forming a bonding metal layer (10) on the circuit wiring pattern (3) by plating; forming a cover coat layer (11) so as to cover the bonding metal layer; further forming a metal mask (13 or 13A) by forming a surface metal layer (12) on the cover coat layer and by etching the surface metal layer (12) or else by forming a mask (14) on the cover coat layer (11) by thin film forming method; removing the cover coat layer (11) and the flexible insulating base member (2) by etching using the metal mask (13 or 13A); removing the metal mask by etching; and bending the elastic metal layer to a desired shape to form the magnetic head suspension.

6 Claims, 3 Drawing Sheets

METHOD OF MANUFACTURING MAGNETIC HEAD SUSPENSION HAVING CIRCUIT WIRING PATTERN

BACKGROUND OF THE INVENTION

1. Field of the Invention

The present invention relates to a method of manufacturing a magnetic head suspension assembly used to drive a magnetic disk, for instance, and more specifically to a method of manufacturing a magnetic head suspension having a circuit wiring pattern member, in which the circuit wiring pattern member for electrically connecting a magnetic head element to a read-write amplifier circuit board is formed integral with the suspension.

2. Description of the Prior Art

The magnetic disk apparatus of the type as described above is usually composed of at least one rotary disk for recording data magnetically, a magnetic head element for reading or writing data from or to each track formed on the rotary disk, and a head locating actuator for moving the magnetic head element to any desired track position and for maintaining the same magnetic head element over the track of the rotary disk.

An example of prior art magnetic head suspension assembly is disclosed in Japanese Patent Publication before examination (Kokai) No. 63-113917, in which the magnetic head element is mounted on a flexible member by use of an epoxy resin and further the flexible member is connected to a load beam by use of laser welding, for instance. Further, a gold-plated copper wire covered with polyurethane is connected to an electrode formed on the magnetic head element by use of ultrasonic welding or soldering, as a lead-out wiring portion. Further, after has been turned by a predetermined number of times, the wiring member is housed in a flexible insulating resin tube, and then mounted on the suspension by caulking a part of the suspension, for instance.

In the prior art magnetic head suspension assembly as described above, when the lead-out wire is connected to the electrode on the magnetic head element, since the connecting workability is severely restricted, the assembling work is not effective, so that the productivity cannot be improved. Further, recently, since there exists such a tendency that the magnetic head element is further small-sized and the number of terminals is further increased, this problem has become serious. In addition, since the rigidity of the lead-out wiring member exerts a harmful influence upon the floating characteristics of the magnetic head element, it has been difficult to obtain an optimum floating position or condition. In addition, since the lead-out wiring member is subjected to air pressure due to the air flow caused by the rotating recording medium, there exists another problem in that a harmful influence is exerted upon the floating position of the magnetic head element.

To overcome these problems, for instance, Japanese Patent Publication before examination (Kokai) No. 53-74414 discloses such a method that a flexible circuit board used in common for both the lead-out wiring member and the suspension is used as a supporting mechanism of the magnetic head element. In this method, however, since there are various problems with respect to the original requirements for the suspension mechanism such that the magnetic head element must be located accurately; an appropriate load must be applied; and a correct floating position must be secured, it is difficult to adopt this method in the recent high-density magnetic disk apparatus.

Therefore, in general, in order to solve the problem related to the lead-out wires, a method has been so far proposed such that the lead-out wires are connected together by use of a flexible circuit board and the circuit board is bonded onto the suspension spring by use of an adhesive for instance.

In this method, however, with increasing speed of the seek operation, in the case where the suspension is considered as having a function as a mechanical element of a servo-system, it is necessary to reduce the weight of the suspension as a composing member of the servo-system. Therefore, in the above-mentioned method such that the flexible circuit board is bonded onto the suspension spring, there arises a problem in that the weight of the suspension is inevitably increased to improve the connecting workability.

Therefore, recently, a suspension formed integral with a predetermined circuit wiring pattern via a flexible insulating base member has been proposed, as disclosed in Japanese Patent Application No. 6-193662.

SUMMARY OF THE INVENTION

With these problems in mind, therefore, it is the object of the present invention to provide a method of manufacturing a magnetic head suspension formed integral with a circuit wiring pattern member.

To achieve the above-mentioned object, the present invention provides a method of manufacturing a magnetic head suspension having a circuit wiring pattern member such that a circuit wiring pattern is formed integral with a suspension via a flexible insulating base member, comprising the steps of: preparing a laminated plate composed of a flexible insulating base member, a conductive layer formed on one surface thereof, and an elastic metal layer formed on the other surface thereof; forming a desired circuit wiring pattern in the conductive layer of the laminated plate and an elastic suspension in the elastic metal layer thereof simultaneously, in accordance with photo-fabrication method including both-side simultaneous exposure method; forming a bonding metal layer on the circuit wiring pattern by plating; forming a cover coat layer so as to cover the bonding metal layer; forming a surface metal layer on the cover coat layer; forming a metal mask in the surface metal layer by etching process; removing both the cover coat layer and the flexible insulating base member by etching using the metal mask; removing the metal mask by etching; and bending the elastic metal layer to a desired shape to form the magnetic head suspension.

Further, it is preferable that in the step of removing the cover coat layer and the flexible insulating base member by etching using the metal mask, any one of etching methods of using plasma etching, chemical etching, and an excimer laser abrasion is adopted.

Further, the present invention provides a method of manufacturing a magnetic head suspension having a circuit wiring pattern member such that a circuit wiring pattern is formed integral with a suspension via a flexible insulating base member, comprising the steps of: preparing a laminated plate composed of a flexible insulating base member, a conductive layer formed on one surface thereof, and an elastic metal layer formed on the other surface thereof; forming a desired circuit wiring pattern in the conductive layer of the laminated plate and an elastic suspension in the elastic metal layer thereof simultaneously, in accordance with photo-fabrication method including both-side simultaneous exposure method; forming a bonding metal layer on the circuit wiring pattern by plating; forming a cover coat layer so as to cover the bonding metal layer; forming a mask having a predetermined hole on the cover coat layer; forming a metal mask on the cover coat layer by use of the mask; removing both the cover coat layer and the flexible insulating base member by etching using the metal mask; removing the metal mask by etching; and bending the elastic metal layer to a desired shape to form the magnetic head suspension.

Further, it is preferable that in the step of removing both the cover coat layer and the flexible insulating base member by etching using the metal mask, any one of etching methods of using plasma etching, chemical etching, and an excimer laser abrasion is adopted.

DETAILED DESCRIPTION OF THE EMBODIMENTS

Figure 1:
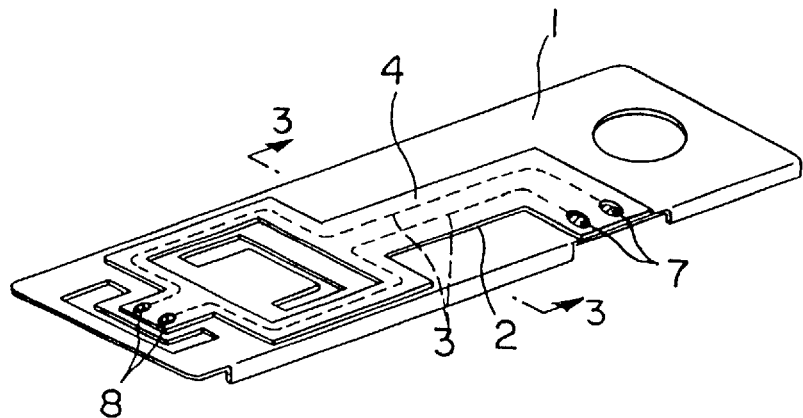
FIG. 1 is a perspective view showing a magnetic head suspension having a circuit wiring pattern member, manufactured by the method according to the present invention.
Figure 2:
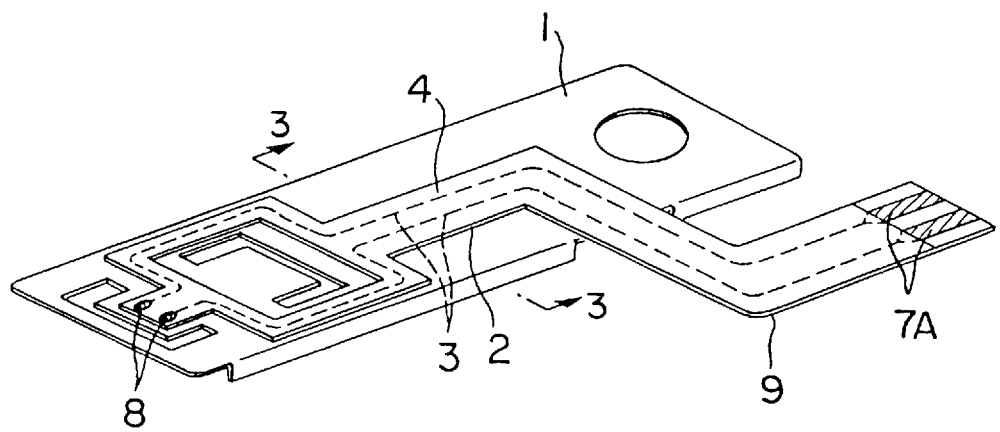
FIG. 2 is a perspective view showing a modification of the magnetic head suspension having a circuit wiring pattern member, manufactured by the method according to the present invention.

FIGS. 1 and 2 show the magnetic head suspension having a circuit wiring pattern member manufactured in accordance with the method according to the present invention.

In FIGS. 1 and 2, a suspension used for a magnetic head is formed integral with a wiring pattern member for connecting a magnetic head element to a read/write amplifier circuit board.

In more detail, the magnetic head suspension having a circuit wiring member shown in FIG. 1 is composed of a suspension 1 formed of an elastic metal (e.g., stainless steel), a flexible insulating base member 2 formed on the suspension 1, and a circuit wiring pattern 3 (shown by dashed lines) formed on the insulating base member 2, and a surface protecting layer 4 for covering the circuit wiring pattern 3. This circuit wiring pattern 3 is used to connect the magnetic head element to the read/write amplifier circuit. Further, four terminals 7 and 8 are formed on the suspension 1.

Further, FIG. 2 shows a modification of the magnetic head suspension having a circuit wiring pattern member shown in FIG. 1. In this modification, the flexible insulating base member 2 is formed with an extension portion 9 extending horizontally outward from the upper surface of the suspension 1. Further, in the same way as with the case shown in FIG. 1, a circuit wiring pattern 3 (dashed lines) is formed on the flexible insulating base member 2 and further covered with the surface protecting layer 4. Further, instead of the two terminals 7 shown in FIG. 1, two terminals 7A to be connected to other elements are formed at one end of the circuit wiring pattern 3 and on the extension portion 9 of the insulating base member 2, without being covered with the surface protecting layer 4.

In both the structures of the suspension shown in FIGS. 1 and 2, the surface protecting layer 4 is formed with predetermined holes to expose the circuit wiring pattern 3. These exposed portions of the circuit wiring pattern 3 are used sa the terminals to be connected to the magnetic head element. Further, these exposed terminal portions are covered with solders or gold so as to form the terminals 7 or 7A and 8.

Figure 3:
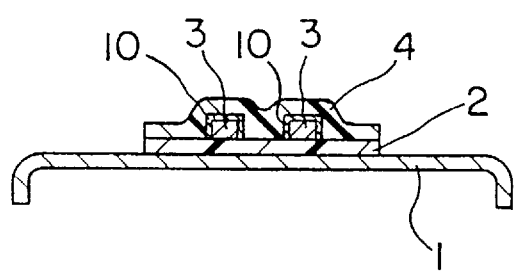
FIG. 3 is a cross-sectional view showing the magnetic head suspension having a circuit wiring pattern member, taken along the line A—A shown in FIG. 1 or FIG. 2.

FIG. 3 is a cross-sectional view of the magnetic head suspension, taken along the line A—A in FIG. 1 or FIG. 2. In FIG. 3, the suspension 1 is formed by a flat elastic metal layer and bent at roughly a right angle on both end portions thereof, respectively. The flexible insulating base member 2 having an appropriate width and formed of a resin (e.g., polyimide resin, epoxy resin, acrylic resin, etc.) is formed on the upper surface of the suspension 1. Further, a desired circuit wiring pattern 3 is formed on the upper surface of the flexible insulating base member 2. Further, a gold-plated layer 10 is formed on the surface of the circuit wiring pattern 3. In addition, the protecting layer 4 is formed on not only the surface of the circuit wiring pattern 3 but also the flexible insulating base member 2.

The method of manufacturing the magnetic head suspension having a circuit wiring member according to the present invention will be explained hereinbelow with reference to FIGS. 4(a) to 4(f). FIGS. 4(a) to 4(f) are cross-sectional views taken along the same line A—A shown in FIG. 1 or FIG. 2, in the same way as with the case of FIG. 3.

Further, in the method described hereinbelow, although etching using an excimer laser abrasion is adopted to remove the resin, it is of course possible to use physical etching (including plasma etching) or chemical etching (strong alkali chemical such as hydrazine).

Figure 4A:
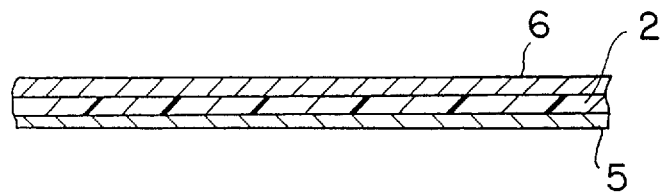
FIGS. 4(a) to 4(f) are cross-sectional views, for assistance in explaining the manufacturing steps of the magnetic head suspension having a circuit wiring pattern member according to the present invention.

First, as shown in FIG. 4(a), a laminated plate is prepared, which is composed of a sheet-shaped flexible insulating base member 2 formed of polyimide resin, an elastic metal layer 5 (e.g., stainless steel) for constructing the suspension 1 and formed on the lower surface of the base member 2, and a conductive layer 6 (e.g., copper foil) for constructing the circuit wiring pattern 3 and formed on the upper surface of the base member 2. The film thickness of the flexible insulating base member 2 is about 3 to 25 $\mu$m; that of the elastic metal layer 5 is about 15 to 70 $\mu$m; and that of the conductive layer 6 is about 3 to 20 $\mu$m.

Figure 4B:
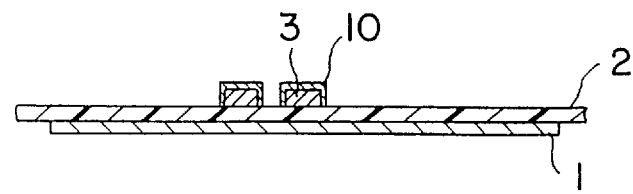

Further, as shown in FIG. 4(b), the conductive layer 6 and the elastic metal layer 5 are both processed by photo-fabrication method (double-side simultaneous exposure method) with the use of a double-side exposing apparatus. The double-side exposing apparatus is provided with a mechanism which can locate both the double-side exposure masks accurately with respect to each other (i.e., on both sides of the conductive layer 6 and the elastic metal layer 5). In more detail, a desired circuit wiring pattern 3 can be formed in the conductive layer 6 and a desired shape of the suspension member 1 can be formed in the elastic metal layer 5. Further, the formed circuit wiring pattern 3 is covered with a gold-plated layer 10 to improve the bonding characteristics between the circuit wiring pattern 3 and the magnetic head element.

Figure 4C:
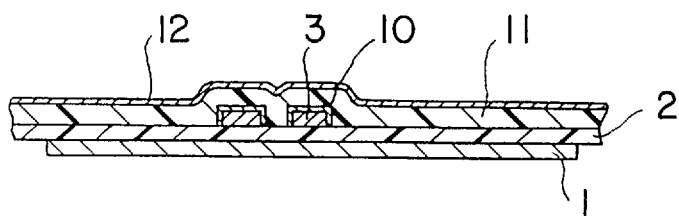

Further, as shown in FIG. 4(c), a cover coat layer 11 formed of an insulating resin is formed on the upper surface of the circuit wiring pattern 3 covered with the gold-plated layer 10. Further, a thin metal layer 12 is formed on the upper surface of the cover coat layer 11 by sputtering method.

Figure 4D:
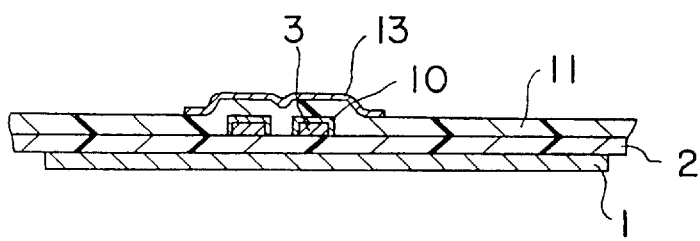

Further, as shown in FIG. 4(d), the thin metal layer 12 is etched to form a metal mask 13 of a desired shape of the insulating base member 2. This metal mask 13 is formed with some holes at the positions where the connection terminals 7 and 8 are to be formed.

Figure 4E:
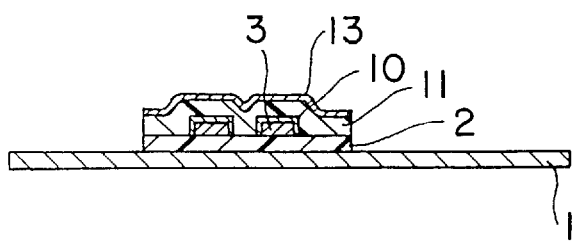

Further, as shown in FIG. 4(e), the cover coat layer 11 and the flexible insulating base member 2 not protected by the metal mask 13 are both etched by plasma etching processing.

Figure 4F:
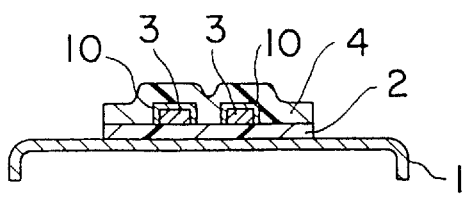

Further, as shown in FIG. 4(f), the metal mask 13 is removed by etching to form the cover coat layer 11 as the surface protecting layer 4. Further, the elastic metal layer 5 is etched and further bent on both ends thereof at roughly a right angle, respectively to form a suspension 1 of a desired shape. As described above, it is possible to manufacture a magnetic head suspension formed integral with a circuit wiring pattern member.

Figure 5A:
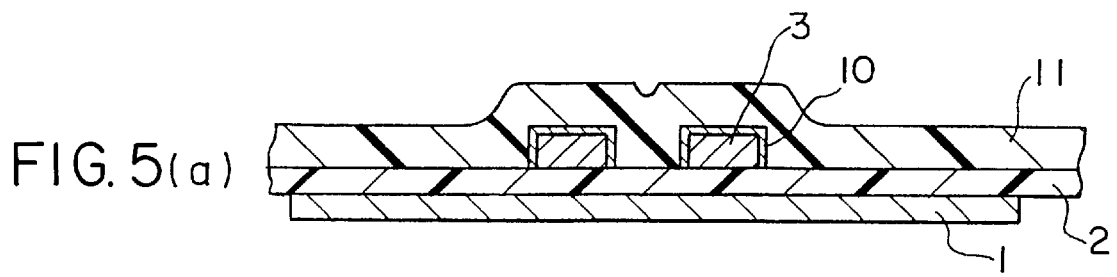
FIGS. 5(a) to 5(c) are cross-sectional views, for assistance in explaining a modification of the manufacturing steps of the magnetic head suspension having a circuit wiring pattern member according to the present invention as described with reference to FIGS. 4(a) to 4(f).
Figure 5B:
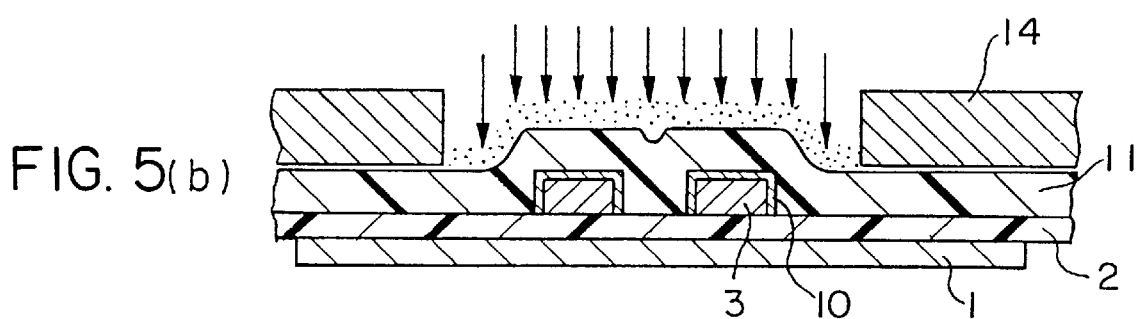
Figure 5C:
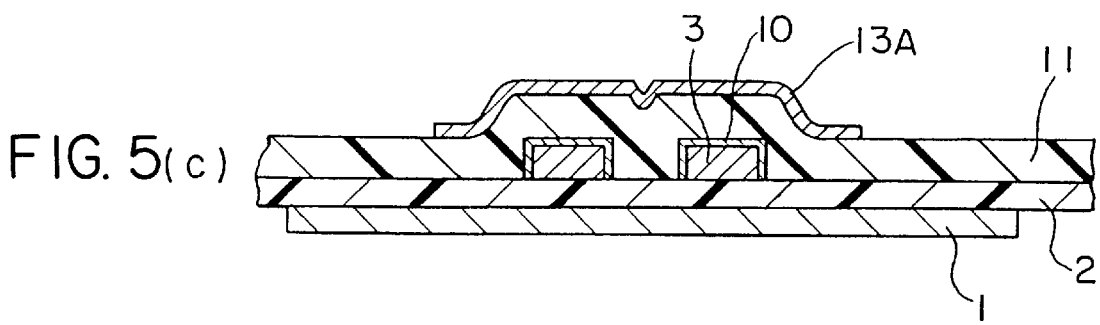

FIGS. 5(a) to 5(c) show a modification of the method of forming a metal mask 13 shown in FIG. 4(d).

FIG. 5(a) shows a preceding step of that shown in FIG. 4(c), in which the cover coat layer 11 has been formed in the same way as in FIG. 4(c) but the thin metal film layer 12 is not formed being different from FIG. 4(c).

In the step shown in FIG. 5(b), a mask 14 is formed on the cover coat layer 11. This mask 14 is formed with a hole at a position where an insulating layer etching mask 13A is to be formed. By use of the mask 14, the insulating layer etching mask 13A is formed on the cover coat layer 11 by sputtering. The mask 14 can be formed in accordance with photo-resist method such that a resist resin is applied, exposed, developed, and then cured. The mask 14 is removed after the insulating layer etching mask 13A has been formed. In this step, it is possible to adopt another thin film forming method, instead of sputtering.

FIG. 5(c) shows a mask 13A formed as described above in the same way as with the case shown in FIG. 4(d).

In the case where the insulating layer etching mask 13A is formed as described above, since the number of steps for photo-fabrication and etching can be both reduced, it is possible to improve the productivity of the total manufacturing process of the suspension having a circuit wiring pattern member.

In the method of manufacturing of the magnetic head suspension having a circuit wiring pattern member as described above, since the suspension and the circuit wiring pattern member can be formed integral with respect to each other, it is unnecessary to bond a flexible circuit board to the suspension, being different from the prior art suspension, so that it is possible to improve the workability of the suspension, without increasing the weight of the suspension.

Further, in the manufacturing method according to the present invention, since the double-side photo-fabrication method is adopted to realize an accurate location between both-side light exposure masks, it is possible to reduce the number of manufacturing steps and thereby the manufacturing cost of the magnetic head suspension having a circuit wiring pattern member.

What is claimed is:

1. A method of manufacturing a magnetic head suspension having a circuit wiring pattern member such that a circuit wiring pattern is formed integral with a suspension via a flexible insulating base member, comprising the steps of:

preparing a laminated plate composed of a flexible insulating base member, a conductive layer formed on one surface thereof, and an elastic metal layer formed on the other surface thereof;

forming a desired circuit wiring pattern in the conductive layer of the laminated plate and an elastic suspension in the elastic metal layer thereof simultaneously;

forming a bonding metal layer on the circuit wiring pattern by plating;

forming a cover coat layer so as to cover the bonding metal layer;

forming a surface metal layer on the cover coat layer;

forming a metal mask in the surface metal layer by etching process;

removing both the cover coat layer and the flexible insulating base member by etching using the metal mask;

removing the metal mask by etching; and bending the elastic metal layer to a desired shape to form the magnetic head suspension.

2. The method of manufacturing a magnetic head suspension having a circuit wiring pattern member of claim 1, wherein in the step of removing the cover coat layer and the flexible insulating base member by etching using the metal mask, any one of etching methods of using plasma etching, chemical etching, and an excimer laser abrasion is adopted.

3. A method of manufacturing a magnetic head suspension having a circuit wiring pattern member such that a circuit wiring pattern is formed integral with a suspension via a flexible insulating base member, comprising the steps of:

preparing a laminated plate composed of a flexible insulating base member, a conductive layer formed on one surface thereof, and an elastic metal layer formed on the other surface thereof;

forming a desired circuit wiring pattern in the conductive layer of the laminated plate and an elastic suspension in the elastic metal layer thereof simultaneously;

forming a bonding metal layer on the circuit wiring pattern by plating;

forming a cover coat layer so as to cover the bonding metal layer;

forming a mask having a predetermined hole on the cover coat layer;

forming a metal mask on the cover coat layer by use of the mask;

removing both the cover coat layer and the flexible insulating base member by etching using the metal mask;

removing the metal mask by etching; and bending the elastic metal layer to a desired shape to form the magnetic head suspension.

4. The method of manufacturing a magnetic head suspension having a circuit wiring pattern member of claim 3, wherein in the step of removing both the cover coat layer and the flexible insulating base member by etching using the metal mask, any one of etching methods of using plasma etching, chemical etching, and an excimer laser abrasion is adopted.

5. A method of manufacturing a magnetic head suspension as recited in claim 1, wherein the step of forming a desired circuit wiring pattern in the conductive layer of the laminated plate and an elastic suspension in the elastic metal layer thereof simultaneously is performed using a photo-fabrication method including both-side simultaneous exposure method.

6. A method of manufacturing a magnetic head suspension as recited in claim 3, wherein the step of forming a desired circuit wiring pattern in the conductive layer of the laminated plate and an elastic suspension in the elastic metal layer thereof simultaneously is performed using a photo-fabrication method including both-side simultaneous exposure method.

* * * * *